United States Patent [19]
Lin

[11] Patent Number: 5,596,545
[45] Date of Patent: Jan. 21, 1997

[54] SEMICONDUCTOR MEMORY DEVICE WITH INTERNAL SELF-REFRESHING

[75] Inventor: Ya-Chi Lin, Fremont, Calif.

[73] Assignee: Ramax, Inc., San Jose, Calif.

[21] Appl. No.: 566,887

[22] Filed: Dec. 4, 1995

[51] Int. Cl.$^6$ ..................................................... G11G 7/00
[52] U.S. Cl. ............................ 365/236; 365/222; 365/233
[58] Field of Search ...................................... 365/222, 233, 365/236, 181, 194

[56] References Cited

U.S. PATENT DOCUMENTS

| 5,033,026 | 7/1991 | Tsujimoto | 365/222 |
| 5,315,557 | 5/1994 | Kim et al. | 365/222 |
| 5,329,490 | 7/1994 | Murotani | 365/222 |
| 5,453,959 | 9/1995 | Sakuta et al. | 365/222 |

*Primary Examiner*—David C. Nelms
*Assistant Examiner*—F. Niranjan
*Attorney, Agent, or Firm*—Jeffrey P. Aiello; Leary, Titus & Aiello

[57] ABSTRACT

A semiconductor memory device with internal self-refreshing is provided. The invented memory device has a programmable internal oscillator for controlling a self-refreshing time period. The internal oscillator obviates the need for an external signal for refreshing data stored in the device's memory cells. The pin-out configuration of the device is analogous to the pin-out configuration of an SRAM device, so that the invented device can replace an SRAM device on a circuit board. The self-refreshing time period is programmable to different time periods depending upon the intended use of the device for minimizing power consumption by the device. The oscillator provides an output pulse for incrementing an address counter which generates internal refreshing addresses and also activates a memory word line for memory cell refreshing. A comparator compares an external address and the internal refreshing address generated by the counter. If the internal address to be written is being refreshed, a timer counts down the refresh time period, before the data is written to the address. The maximum write delay time period is equal to the refresh time period. Data can be read from an internal address, when the address is being refreshed, so that there is no read time delay. The invented device has memory cells of a simple structure, analogous to the cell structure of a DRAM device, so that the device of the present invention has a relatively low cost of manufacture. Further, the memory cell structure enables the device to have substantially high storage capacity.

24 Claims, 4 Drawing Sheets

SEMICONDUCTOR MEMORY DEVICE WITH INTERNAL SELF-REFRESHING

BACKGROUND OF THE INVENTION

1. Field of the Invention

The present invention relates generally to semiconductor memory devices, and more particularly, to a semiconductor memory device with internal self-refreshing.

2. Description of Related Art

Semiconductor Dynamic Random Access Memory (known as DRAM) devices or "chips" have increased in capacity of at the rate of approximately quadruple every three years. With their increasing memory capacity, DRAM chips are widely used in several electronic devices such as portable personal computers, word processors, and printers. Customarily, Static Random Access Memory (SRAM) chips were used in such applications as portable personal computers and word processors, due to their small consumption of electrical power.

However, the use of DRAM chips instead of SRAM chips in these devices is desirable, since the cost of a DRAM chip is substantially less than the cost of an SRAM chip of equal memory capacity. DRAM devices are substantially less to fabricate than SRAM devices, since SRAM devices have a complex memory cell structure. It is well known that a DRAM device has one transistor per memory cell, while an SRAM chip typically uses either four or six transistors per cell. A further advantage of DRAM chips, is that since there is only one transistor per memory cell, a DRAM chip may have quadruple the memory capacity of a like dimensioned SRAM chip.

Despite the memory capacity advantages and low cost of fabricating DRAM devices, a disadvantage of DRAM chips, is that an external data refreshing signal is required to refresh and maintain data stored in the memory cells of the chip, while SRAM chips do not require an external data refresh signal. Thus, the timing waveforms of read data and write data cycles of these devices are different than SRAM devices, since they have a dedicated refresh time period. A further disadvantage of DRAM chips, is that due to the requirement of the external data refresh signal, DRAM devices typically consume more power than SRAM devices.

It therefore would be advantageous to provide a semiconductor memory device that combines the advantages of DRAM devices, such as high memory capacity, simple memory cell structure, and low cost, and SRAM devices, such as internal self-refreshing.

There have been number of attempts at achieving the above described advantages in the prior art. One such attempt is disclosed in U.S. Pat. No. 5,453,959, to Sakuta et al. The disclosed device comprises a semiconductor dynamic random access memory (DRAM) device equipped with a self-refreshing control circuit of a simplified structure. A counter circuit is provided for counting output pulses from a basic oscillator to produce first, second, and third counting outputs. A first detecting circuit, having a first programmable circuit, receives the first counting output from the counter circuit to detect that a predetermined signal input state continues for a set time period, set by the first programmable circuit.

A second detecting circuit receives the second counting output from the counter circuit to detect that refreshing of all memory cells has been completed. A third detecting circuit, having a second programmable circuit, receives the third counting output from the counter circuit to detect that a pause time set by the second programmable circuit has elapsed. The first to third detecting circuits are controlled by a control circuit. A disadvantage of the disclosed DRAM device is that it appears all memory cells in a block are simultaneously refreshed, which could slow down writing of data into the memory cells of the device.

U.S. Pat. No. 5,329,490, to Murotani, is directed to a dynamic semiconductor memory array device with refresh function. The disclosed memory cell array is divided into several memory cell array portions. Each memory cell array portion has a refresh period determined, so as to be adapted to a memory cell having minimum data retention time among memory cells therein. Thus, different memory cell array portions have different refresh periods. The disclosed device purportedly has the advantage over conventional memory cell arrays, where all memory cell array portions are refreshed with a common refresh period, in that consumption of electrical power by refresh can be enormously reduced relative to the conventional memory cell array. A disadvantage of the disclosed device, is that an external data refreshing signal must be applied to the device for data refreshing, thus the pin-out configuration of the device cannot match the pinout of an SRAM device.

A semiconductor memory device having self-refresh and back-bias circuitry is disclosed in U.S. Pat. No. 5,315,557, to Kim et al. A semiconductor memory device, such as a DRAM or pseudo-static RAM device, includes a self-refresh device that comprises a refresh timer for generating a refresh clock pulse, a binary counter for generating a predetermined number of signals of different frequencies in response to the refresh clock pulse, a circuit for generating a self-refresh enable signal in response to the signal transmitted from the binary counter. A back-bias clock pulse generator is also included having first, second, and third selectors, of which the third selector selects one of the signals transmitted from the binary counter in response to a signal output from each of the first and second selectors.

A back-bias generator having an oscillator and a back-bias voltage detecting circuit and selection circuit for receiving the output signal from the back-bias voltage detection circuit is attached thereto. A signal is transmitted to the oscillator in response to the self-refresh enable signal. The oscillator output, together with the output of the back-bias control pulse generator, causes a driver control circuit to feed a drive signal to a charge pump during a self-refresh operation. A disadvantage of the disclosed device, is that the external the self-refresh enable signal must be applied to the device to implement the self-refresh, and thus, the pin-out of the device is different than an SRAM device.

U.S. Pat. No. 5,033,026, to Tsujimoto, is directed to a pseudo-static RAM device which operates at a high speed in reading or writing mode and permits a long refreshing period in a self-refreshing mode. In the disclosed pseudo-static RAM device, an activation signal for enabling sense amplifiers is generated with a variable delay time, from a time point when a designated word line is driven. The delay time is switched in response to a control signal representing the self-refreshing mode. The delay time should be long enough to transfer 100% of the amount of information stored in the designated driven memory cell, to the bit line connected thereto. The delay time is maintained short when the control signal representing the self-refreshing mode is not present.

An apparent disadvantage common to the prior art, is that an external signal must be applied to the device to implement refreshing of data stored in the device's memory cells. Since the external refresh signal must be applied to the device, the pin-out configuration of prior art devices is different than the pin-out configuration of SRAM devices. Further since the external refresh signal must be applied to the device, the timing waveforms of these devices are different than SRAM devices. Therefore, these devices are not well suited for replacing SRAM chips in various applications, such as on an existing printed circuit board.

There, therefore exists a need for a semiconductor memory device that does not require that an external signal be applied to the device to implement data refreshing so that the device may replace an SRAM chip on an existing printed circuit board, and which has memory cells of a simple cell structure for high data storage capacity.

OBJECTS OF THE INVENTION

It is therefore an object of the present invention to provide an improved semiconductor memory device that does not require an external signal for implementing refreshing of data stored in the device's memory cells;

It is another object of the present invention to provide an improved semiconductor memory device that has memory cells of a simple cell structure;

It is a further object of the present invention to provide an improved semiconductor memory device that has memory cells of a simple cell structure with a pin-out configuration analogous to the pin-out configuration of a static random access memory device;

It is still another object of the present invention to provide an improved semiconductor memory device having substantially greater memory capacity than a similarly dimensioned static random access memory device:

It is yet a further object of the present invention to provide an improved semiconductor memory device that minimizes power consumption by the device and power surge noise when data stored in the device is refreshed;

It is another object of the present invention to provide an improved semiconductor memory device having a write delay time period that is equal to a refresh time period;

It is further object of the present invention to provide an improved semiconductor memory device without a read delay time period; and It is still another object of the present invention to provide an improved semiconductor memory device where memory cells in an entire memory cell array are not simultaneously refreshed.

SUMMARY OF THE INVENTION

These and other objects and advantages of the present invention are achieved by providing an improved semiconductor memory device with internal self-refreshing. The invented memory device has a programmable internal oscillator or clock generator for controlling a self-refreshing time period. The clock generator comprises a known CMOS ring oscillator, with programmable elements constructed of fuse means, for example. The fuse means may be opened for increasing the self-refreshing time period. The self-refreshing time period, determined by the oscillator, is programmable to different time periods depending upon the intended use of the present invention. Thus, power consumption by the invented memory device can be minimized.

The internal oscillator obviates the need for an external refresh signal to be applied to the invented device for refreshing data stored in the device's memory cells. Therefore, the pin-out configuration of the invented device is analogous to the pin-out configuration of a static random access memory device, unlike prior art DRAM or pseudo-static random access memory (pseudo-SRAM) devices which require an external refresh input. Thus, the invented memory device can be used to replace existing SRAM chips on a printed circuit (PC) board, without altering the layout of the PC board. Further, the memory device of the present invention has the same read and write timing cycles as an SRAM device, for compatibility with peripheral devices.

The clock generator provides output pulses for incrementing an address counter which generates internal refreshing addresses and activates a single memory word line of a single memory cell array, of a plurality of memory cell arrays, for refreshing memory cells in the word line. Therefore, a plurality of word lines are not simultaneously refreshed for reducing power surge noise produced by the device. A comparator compares an external address and the internal refreshing address generated by the counter. If the internal address to be written is being refreshed, a programmable timer counts down the self-refreshing time period, before the data is written to the address. Thus, the maximum write delay time period is equal to the self-refreshing time period.

Data can be read from an internal address, when the address is being refreshed, so that there is no read delay time period. Additionally, during a read cycle only the word line containing the data to be read is activated, as opposed to prior art DRAM devices, where the same word line in each memory cell array is activated, causing the device to generate substantial noise. Therefore, the read cycle of the present invention ranges from 5 to 10 nanoseconds less than known DRAM devices.

The internal self-refreshing process preferably comprises, the internal clock generator providing output pulses to the internal address counter. The internal refreshing addresses are continuously incremented to corresponding word lines in a different memory cell array. Initially, a first memory cell word line in a first memory cell array is refreshed. The internal refreshing address is incremented to a first word line in a second memory cell array, which in then refreshed. This process continues until the first word line in each of the memory cell arrays is refreshed.

The internal address counter then increments the internal refreshing address to a second word line in the first memory cell array, for refreshing the memory cells of the second word line. The internal refreshing address is then incremented to the second word line in the second memory cell array. The process continues until the last word line in the last memory cell array is refreshed. The internal refreshing address is then incremented to the first word line in the first array for refreshing data in the word line. The counter continuously increments the refreshing address for continuously refreshing data stored in the memory cell arrays.

If the comparator detects that the external address to be written matches the internal address being refreshed, the timer counts down the self-refreshing time period, the data is then written to the address. Thus, the maximum write delay time period is equal to the self-refreshing time period.

The invented device has memory cells of a simple cell structure, analogous to a DRAM device. Preferably, the memory cells of the present invention comprise a single transistor, so that the device of the present invention has a relatively low cost of manufacture. Further, since the memory cells comprise a single transistor, the invented device has substantially high data storage capacity, up to approximately four to six times greater than the data storage capacity of a like dimensioned SRAM device.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings, in which:

DESCRIPTION OF THE PREFERRED EMBODIMENTS

The following description is provided to enable any person skilled in the art to make and use the invention and sets forth the best modes contemplated by the inventor of carrying out his invention. Various modifications, however, will remain readily apparent to those skilled in the art, since the generic principles of the present invention have been defined herein.

Figure 1:
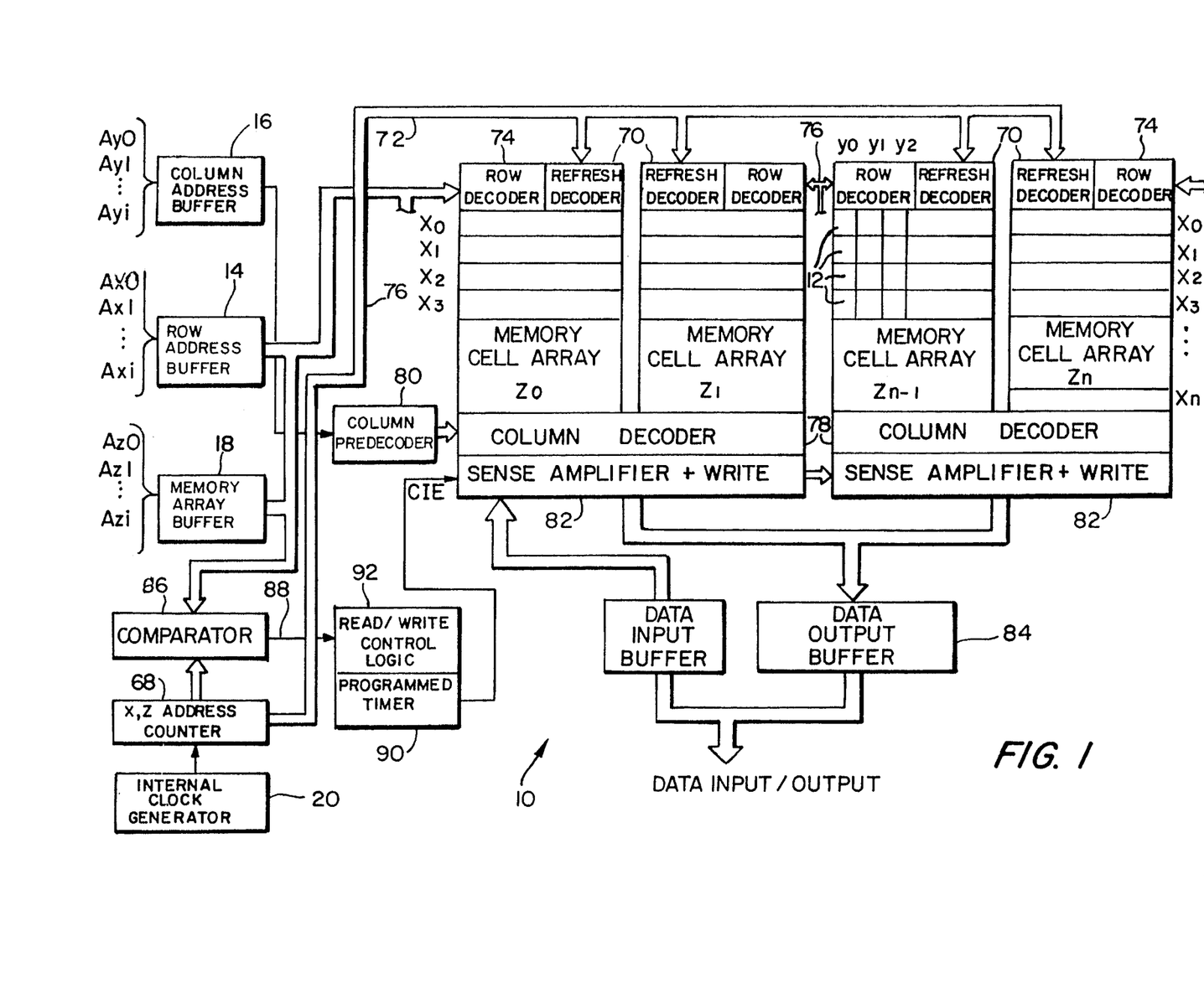
FIG. 1 is a block diagram of a preferred embodiment of a semiconductor memory device with internal self-refreshing of the present invention.

Referring now to FIG. 1 of the drawings, there is shown a preferred embodiment of a semiconductor memory device 10 with internal self-refreshing, constructed according to the principles of the present invention. The device 10 may be fabricated, using known CMOS technology and methods, on a single semiconductor substrate, such as polysilicon (polycrystalline silicon) for example. The device 10 includes a plurality of memory cell arrays $Z_0$–$Z_n$, configured to known data storage capacities such as 1024 rows and 512×8 columns, for example only. The memory storage of the device is partitioned into arrays $Z_0$–$Z_n$ to maximize the speed with which data stored in an array Z is accessed. Each array Z comprises a matrix of rows $X_0$–$X_n$ and columns $y_0$–$y_n$. A row X of memory cells comprises a word line.

In the preferred embodiment, the memory cell arrays $Z_0$–$Z_n$ comprise a plurality of dynamic memory cells 12, such as those embodied in known dynamic random access memory (DRAM) devices. In this embodiment, each memory cell 12 typically comprises a single transistor, as is well known and thus not shown in the drawings. Since the device 10 of the present invention is provided with single transistor memory cells 12, the device 10 has substantially high data storage capacity, ranging up to approximately four to six times greater than the data storage capacity of a like dimensioned static random access memory (SRAM) device, depending upon the number and configuration of the memory arrays $Z_0$–$Z_n$.

The device 10 is provided with row address terminals $Ax_0$–$Ax_i$, column address terminals $Ay_0$–$Ay_i$, and memory array address terminals $Az_0$–$Az_i$, for receiving address signals. The address terminals Ax, Ay, and Az are coupled to a row address buffer 14, column address buffer 16, and memory array address buffer 18, respectively. The buffers 14, 16, 18 shift the voltage level of signals from the terminals Ax, Ay, Az, to internal CMOS voltage levels, such as 5 volts, to increase the necessary driving capability of data from the terminals Ax, Ay, Az.

Figure 2:
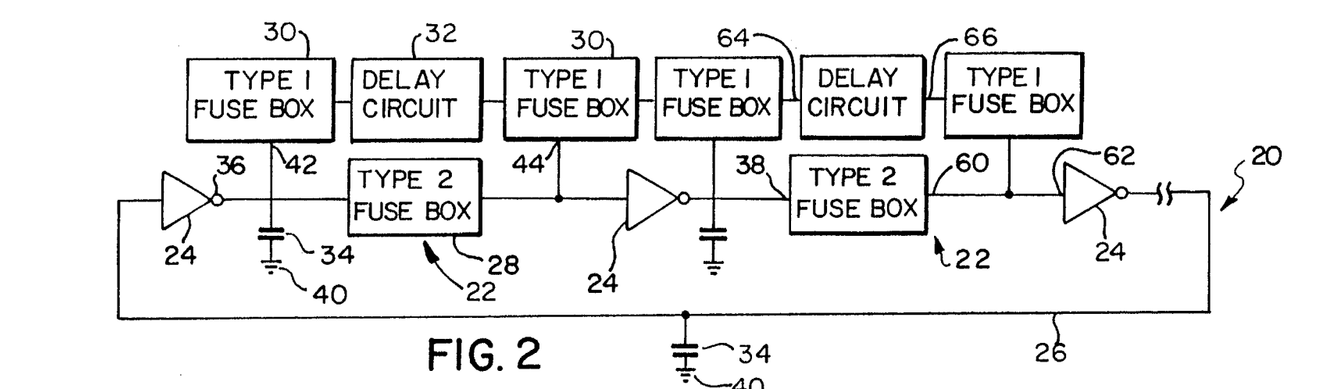
FIG. 2 is a block diagram of a programmable internal clock generator of the preferred embodiment.
Figure 3:
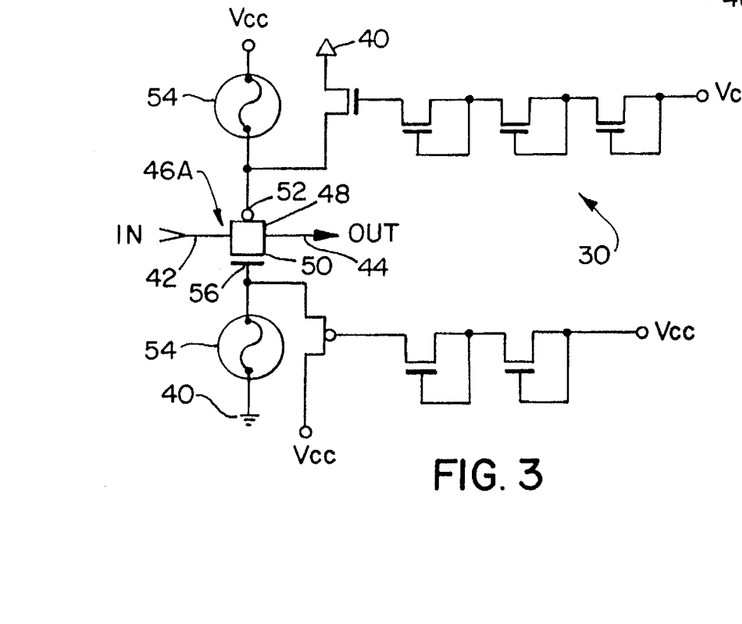
FIG. 3 is a schematic diagram of a type 1 fuse box of the internal clock generator of the present invention.
Figure 4:
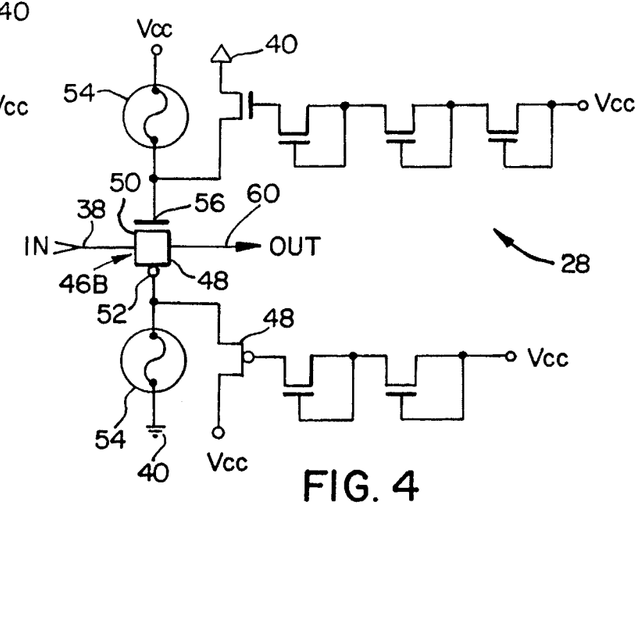
FIG. 4 is a schematic diagram of a type 2 fuse box of the internal clock generator of the present invention.

Referring now to FIGS. 1–4, and particularly to FIGS. 2–4, in the preferred embodiment, the device 10 is provided with an internal oscillator or clock generator 20 for generating and adjusting a self-refreshing time period. The clock generator 20 comprises a programmable CMOS ring oscillator that is provided with programmable elements 22 for adjusting, such as increasing, the self-refreshing time period. The internal clock generator 20 preferably comprises an odd number of CMOS inverters 24 connected in a known ring configuration 26, with the programmable elements 22 therebetween.

The programmable elements 22 include a type 2 fuse box 28 connected in series between two inverters 24. A type 1 fuse box 30 is coupled in series to a delay circuit 32, which is coupled in series to a second type 1 fuse box 30, all of which are couple in parallel to the type 2 fuse box 28. A capacitor 34, of a suitable value, is interposed between an output terminal 36 of an inverter 24 and an input 38 of a type 2 fuse box 28, and connected to ground 40. The capacitor 34 acts as a "dummy" capacitor for simulating the inherent capacitance of a memory cell 12.

Referring to FIG. 3 there is shown a type 1 fuse box 30. The fuse box 30 has an input terminal 42 connected to the output 36 of an inverter 24, and an output terminal 44 connected to either the delay circuit 32 or an inverter 24. The input and output terminals 42, 44 are coupled together through a transmission gate 46A. The transmission gate 46A comprises a p-MOS transistor 48 connected to an n-MOS transistor 50, as is known in the art. A gate 52 of the p-MOS transistor 48 is connected to a fuse 54 coupled to a CMOS voltage source Vcc. A gate 56 of the n-MOS transistor 50 is connected to a fuse 54 coupled to ground 40. The fuses 54 are made of polysilicon, in which first polysilicon layers can be selectively cut out by a high energy beam, such as laser radiation. The configuration of the type 1 fuse box 30 isolates the input 42 and output 44, to prevent the flow of current through the transmission gate 46A, when the fuses 54 are intact.

Referring to FIG. 4, the type 2 fuse box 28 is shown. The input terminal 38 is coupled to the output terminal 36 of an inverter 24, and an output terminal 60 of the fuse box 28 is connected to an inverter 24. The input and output terminals 38, 60 of the type 2 fuse box 28 are connected through an inverted transmission gate 46B. In the inverted transmission gate 46B, the gate 52 of the p-MOS transistor 48 is connected to a fuse 54 coupled to ground 40, and coupled to another p-MOS transistor 48 connected to the CMOS voltage source Vcc. The gate 56 of the n-MOS transistor 50 is connected to a fuse 54 coupled to the CMOS voltage source Vcc. In the configuration of the type 2 fuse box 28, the input and output terminals 38, 60 are coupled together, so that current flows through the transmission gate 46B, when the fuses 54 are intact.

Figure 5:
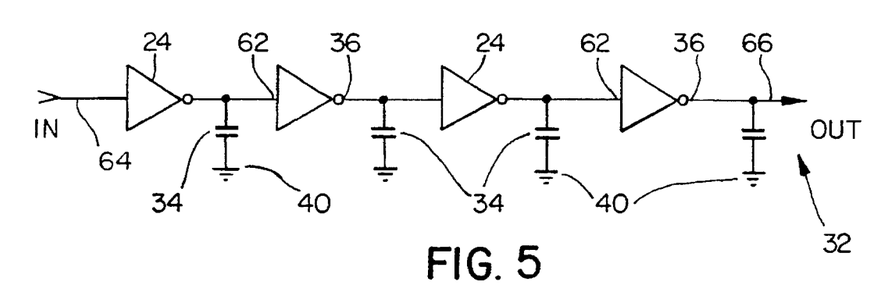
FIG. 5 is a schematic diagram of a programmable timer of the preferred embodiment.

Referring to FIG. 5, the delay circuit 32 has an input terminal 64 coupled to the output terminal 44 of a type 1 fuse box 30, and an output terminal 66 coupled to the input 42 of a type 1 fuse box 30. The circuit 32 preferably comprises an even number of inverters 24 connected in series. The output 36 of each inverter is coupled to the input 62 of the next inverter 24, and to a capacitor 34, for controlling the flow of current through the circuit 32.

Referring again to FIG. 2, if no fuses 54 are blown in the type 2 fuse boxes 32, and fuses 54 are blown in the type 1 fuse boxes 30, current flows through the inverters 24 and in the ring 26, and the self-refreshing time period is at its minimum. If fuses 54 are blown in the type 2 fuse boxes 28 and are intact in the type 1 boxes 30, current flows through the delay elements 22 for increasing the self-refreshing time period. The fuses 54 in various predetermined fuse boxes 28, 30 may be blown for increasing the self-refreshing time period, depending upon the desired use of the invented device 10.

Referring again to FIG. 1, the clock generator 20 is coupled to an address counter 68 that receives output pulses from the clock generator 20 for incrementing the counter 68. The counter 68 continuously generates an internal refreshing address, indicative of a word line X to be refreshed, and transmits a refresh signal to a corresponding one of a plurality of refresh decoders 70 via a bus 72. Each of the memory arrays $Z_0$–$Z_n$ is provided with a refresh decoder 70 for activating a memory word line X corresponding to the refreshing address generated by the counter 68.

Each of the arrays Z is additionally provided with a row decoder 74 coupled to the row address buffer 14 and memory array buffer 18 via a bus 76. The row address decoders 74 receive signals from the address buffers 14, 18 for determining a word line X to be activated for writing data into, or reading out of, the selected word line X of the determined array Z. The arrays $Z_0$–$Z_n$ are each provided with a column decoder 78 coupled to the column address buffer 18, via a column pre-decoder 80, as is known in the art. A sense amplifier 82 is also coupled to the arrays $Z_0$–$Z_n$ as is known.

The refresh decoders 70 are provided solely for activating a word line X to be refreshed, responsive to a refreshing address generated by the counter 68. When a word line X is activated by a refresh decoder 70, the corresponding sense amplifier 82, reads the data stored in the word line X, amplifies the data, and writes the amplified data back into the word line X, thus refreshing the data. The sense amplifiers 82 enable data stored in the word line X being refreshed, to be read out through a data buffer 84.

The present invention uses an incremental refreshing process for self-refreshing of data stored in the memory arrays $Z_0$–$Z_n$, so that there is not a substantial time delay when it is desired to write data into an array Z. The counter 68 of the present invention increments the internal refreshing address with a refresh process that preferably comprises, for example, first incrementing the internal refreshing address to a first word line $X_0$ in a first memory cell array $Z_0$ corresponding to the internal refreshing address. The corresponding refresh decoder 70 then activates the word line $X_0$, and the sense amplifier 82 refreshes the data as previously discussed. The counter 68 then increments the refreshing address to a first word line $X_0$ in a second memory cell array $Z_1$. The refresh decoder 70 then activates the word line $X_0$ and the data is refreshed by the amplifier 82. The counter 68 continuously increments the internal refreshing address until data stored in the first word line $X_0$ in each of the memory cell arrays $Z_0$–$Z_n$ is refreshed.

The counter 68 then increments the refreshing address to a second word line $X_1$ in the first memory cell array $Z_0$. The data in the word line $X_1$, is refreshed as discussed. The counter 68 then increments the refreshing address to a second word line $X_1$ in the second memory cell array $Z_1$. The counter 68 continuously increments the internal refreshing address, until a last word line $X_n$ in the last memory cell array $Z_n$ is refreshed. The counter 68 then increments the refreshing address to the first word line $X_0$ in the first memory cell array $Z_0$. The counter 68 continuously increments the refreshing address, for continuously refreshing data stored in each word line $X_0$–$X_n$ of each memory cell array $Z_0$–$Z_n$, during one self-refreshing time period. Thus, an entire memory cell array Z, or all memory arrays Z, are not simultaneously refreshed, which would increase the time delay when writing data into a desired word line X. Further, since an entire memory cell array Z, or all memory arrays Z, are not simultaneously refreshed, the device 10 does not generate substantial power surge noise when data is refreshed, so that there is not potential loss of data or system noise when refreshing data.

A comparator 86 is coupled to the address counter 68 and to the row address 24 and memory address 28 buffers. The comparator 86 compares an external address to be written, indicated by the row address buffer 14, and the internal refreshing address generated by the counter 68, for determining if an internal address to be written matches the internal address that is being refreshed. If the comparator 86 detects that the external address to be written matches the internal address being refreshed, the comparator 86 transmits a signal, across match line 88, to a programmable timer 90, via read/write control logic 92.

The timer 90 is programmable so that a maximum write delay time period, determined by the timer 90, is equal to one self-refreshing time period, generated by the clock 20. The timer 90 may be configured using any known means, such as circuitry equivalent to the programmable circuitry of the clock 20, for example.

If the comparator 86 detects a match between the external address to be written and the internal address being refreshed, the control logic 92 prevents the data from being written by holding an internal write signal CIE "hi" (digital logic level 1), and the timer 90 begins counting down the write delay time period. When the write delay has expired, the control logic 92 causes the write signal CIE to go "low" (digital logic level 0), and the data is written to the desired address. In the device 10 of the present invention, there is no simultaneous write data contention problem within a signal memory array Z, since only one word line X in each array Z is being refreshed for a refreshing period.

In the preferred embodiment, the comparator 86 comprises exclusive-OR (XOR) digital logic gates as well known in the art and thus not shown in the drawings. However, the comparator 86, as well as the control logic 92, may comprise any applicable configuration of digital logic devices, which in combination, achieve the desired functions of the comparator 86 and the control logic 92, respectively.

Figure 6A:
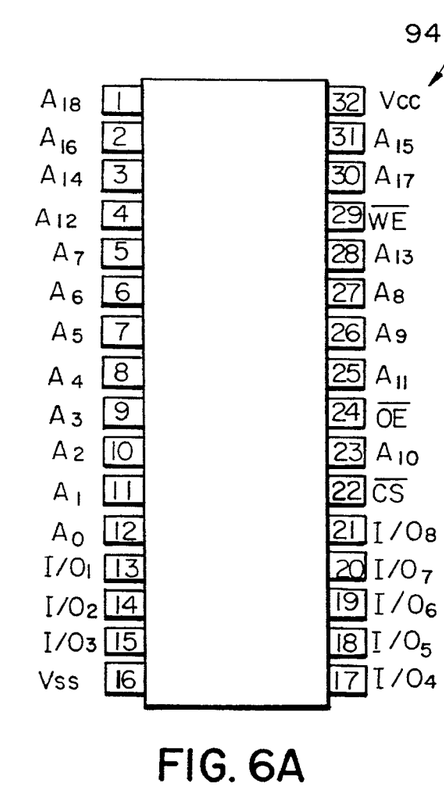
FIG. 6A is a schematic diagram of showing the pin-out configuration of a static random access memory device.
Figure 6B:
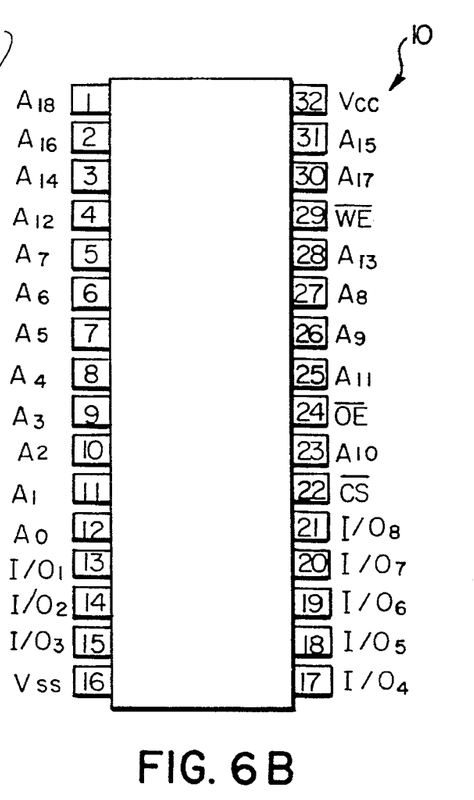
FIG. 6B is a schematic diagram of showing the pin-out configuration of the memory device of the present invention.

Referring now to FIGS. 6A and 6B, there is shown a schematic diagram of a semiconductor static random access memory (SRAM) device 94 as is known, and the memory device of the present invention 10, showing the pin-out configuration of each of the devices 94, 10. As can be clearly seen from the figures, the pin-out configuration of the invented memory device 10 matches the pin-out of the SRAM device 94. Since the invented device 10 does not require an external refresh signal, the pin-out of the device present invention matches the pin-out of the SRAM device 94. The device 10 may be provided with input terminals, such as address inputs $A_0$–$A_{18}$, Write Enable $\overline{WE}$, Chip Select $\overline{CS}$, and Output Enable $\overline{OE}$, Data Input/Output terminals $I/O_1$–$I/O_8$, Power input Vcc, and Ground Vss, as is known in the art.

Figure 7A:
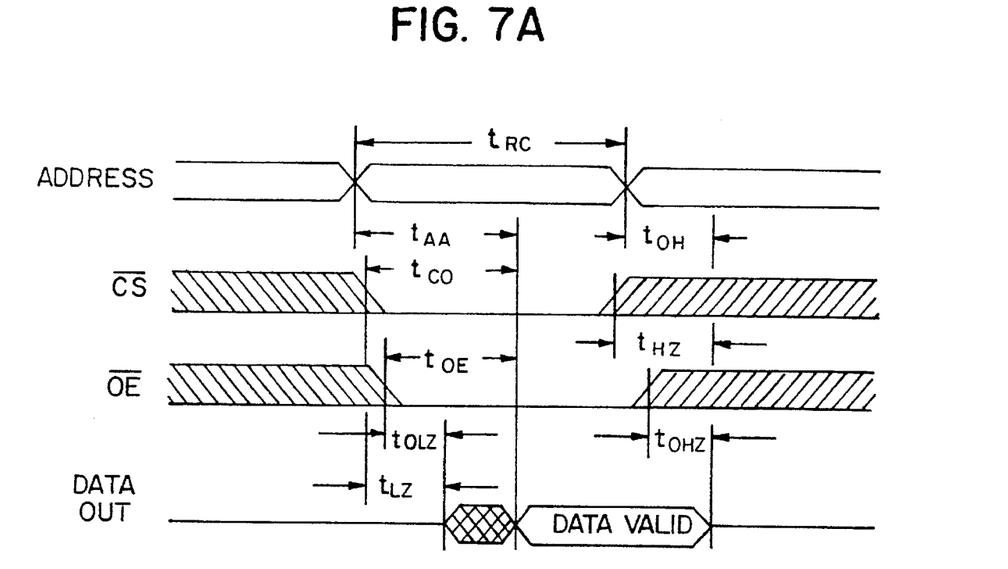
FIGS. 7A and 7B are timing diagrams of the present invention.
Figure 7B:
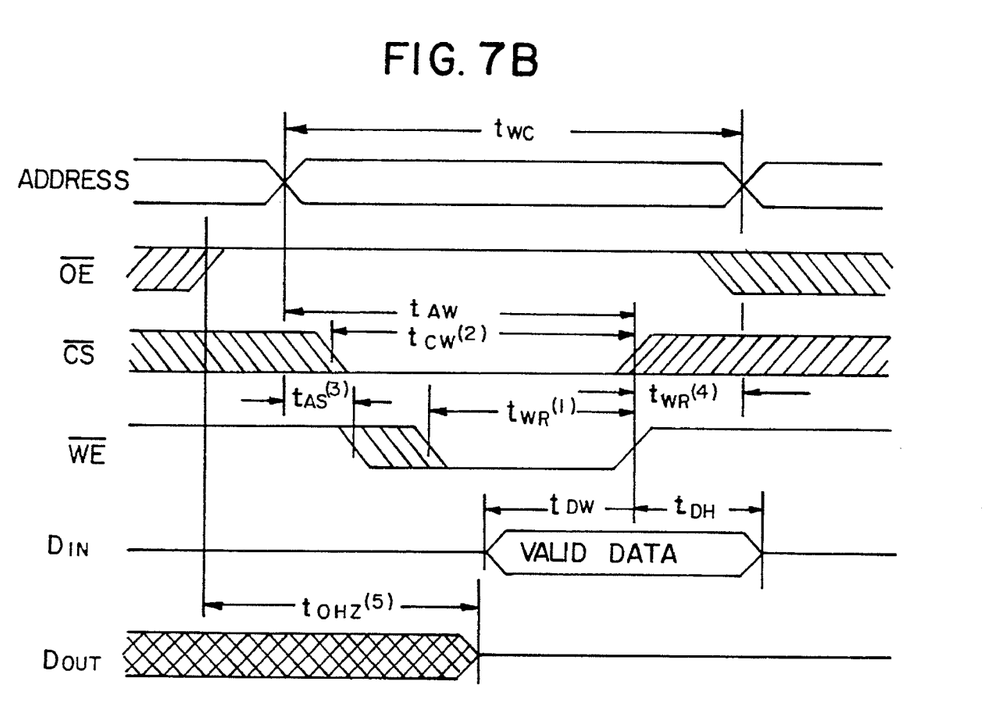

Referring to FIGS. 7A and 7B of the drawings, there are shown timing diagrams as may be typically representative of the timing of the device 10 present invention. FIG. 7A shows the timing of a typical read operation of the present invention 10, while FIG. 7B shows the timing of a typical write operation. As is well know to those skilled in the art, the timing of the read and write operations of the invented device 10 is analogous to the timing of read and write operations of SRAM devices currently in use, since refresh timing is not required. Data can be read from an internal address, when the address is being refreshed, so that there is no read delay time period.

Additionally, during a read cycle only the word line X in the predetermined memory cell array Z containing the data to be read is activated, as opposed to prior art DRAM devices, where the same word line ($X_0$ for example) in each memory cell array $Z_0$–$Z_n$ is activated, causing the device to generate substantial noise. Therefore, the read cycle of the present invention 10 ranges from 5 to 10 nanoseconds less than known DRAM devices. Since the timing of the read and write operations of the invented device 10 is analogous to the timing of read and write operations of SRAM devices currently in use, the present invention 10 provides facile replacement of an existing SRAM device 94 on an existing printed circuit (PC) board (not shown).

Thus, there has been described an improved semiconductor memory device with internal self-refreshing. The invented memory device has a programmable internal clock generator for controlling a self-refreshing time period. Thus, power consumption by the invented memory device can be minimized. The internal oscillator further obviates the need for an external refresh signal to be applied to the invented device for refreshing data stored in the device. Therefore, the pin-out configuration of the invented device is analogous to the pin-out configuration of a static random access memory device, unlike devices in the prior art, which require an external refresh input. The address counter continuously generates the internal refreshing address for refreshing a word line in a memory array. If it is desired to write data into a word line being refreshed, the timer counts down a write delay time period, which is equal to the self-refreshing time period. Thus, the maximum write delay time period is equal to the self-refreshing time period. Data can be read from an internal address, when the address is being refreshed, so that there is no read delay time period. The invented memory device can be used to replace existing SRAM chips on a PC board, without altering the layout of the PC board. The invented device has memory cells of a simple cell structure, so that the device of the present invention has a relatively low cost of manufacture and substantially high data storage capacity, up to approximately four to six times greater than the data storage capacity of a like dimensioned SRAM device.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

What is claimed is:

1. A semiconductor memory device having internal self-refreshing comprising:

an internal oscillator for generating and adjusting a self-refreshing time period;

a plurality of memory cell arrays, each array comprising a matrix of rows and columns, a row of memory cells comprising a word line;

an address counter receiving output pulses from the oscillator for incrementing the counter, the counter generating an internal refreshing address and activating a memory word line corresponding to the refreshing address for refreshing data in the word line, the counter being incremented, such that upon refreshing a first word line in a first one of the memory cell arrays, the internal refreshing address is incremented to a first word line in a second memory cell array, each word line being refreshed during one self refreshing time period;

a timer for counting down a write delay time period;

control logic coupled to the timer; and a comparator for comparing an external address to be written and the internal refreshing address generated by the counter, whereby if the comparator detects that the external address to be written matches the internal address being refreshed, the comparator transmits a signal to the control logic which signals the timer to begin counting down the write delay time period, the control logic enabling the writing of data to the refreshed address after the write delay has expired, such that a maximum write delay time period is equal to one self-refreshing time period, the device enabling data stored in the internal refreshing address to be read while being refreshed.

2. The device of claim 1 wherein the oscillator comprises a programmable CMOS ring oscillator, the oscillator provided with programmable elements comprising fuse means, so that the fuse means may be opened for increasing the self-refreshing time period, the self-refreshing time period being programmable to different time periods depending upon the intended use of the device for minimizing power consumed by the device.

3. The device of claim 1 wherein the memory cells comprises a simple cell structure so that the device has high data storage capacity.

4. The device of claim 3 wherein each of the memory cells comprises a single transistor for providing a relatively low cost of manufacture of the device.

5. The device of claim 3 wherein each of the memory cells comprises a single transistor so that the device has substantially high data storage capacity ranging up to approximately four to six times greater than the data storage capacity of a like dimensioned static random access memory semiconductor device.

6. The device of claim 1 wherein the device has a pin-out configuration analogous to a pin-out configuration of a static random access memory device.

7. The device of claim 1 wherein the address counter further increments the internal refreshing address, such that data stored in a first word line in a first memory cell array corresponding to the internal refreshing address is refreshed, the counter then increments the refreshing address to a first word line in a second memory cell array for refreshing data stored in the word line, the counter continuously incrementing the internal refreshing address until data stored in the first word line in each of the memory cell arrays, of the plurality of memory cell arrays, is refreshed, the counter incrementing the refreshing address to a second word line in the first memory cell array for refreshing data stored in the word line, the counter then incrementing the refreshing address to a second word line in the second memory cell array for refreshing data stored in the word line, the counter continuously incrementing the internal refreshing address until a last word line in a last one of the memory cell arrays is refreshed, the counter then incrementing the refreshing address to the first word line in the first memory cell array for refreshing data stored in the word line, such that the counter continuously increments the refreshing address for continuously refreshing data stored in each word line of each memory cell array and to reduce noise generated by the device when data is refreshed.

8. The device of claim 7 wherein only a predetermined word line containing data to be read is activated during a read cycle for reducing the read cycle of the device, and wherein the device has read and write timing cycles analogous to read and write timing cycles of a static random access memory device.

9. The device of claim 7 further comprising:
 a plurality of refresh decoders, one refresh decoder for each memory cell array, the refresh decoder activating a word line corresponding to the internal refreshing address generated by the counter; and
 a plurality of sense amplifiers, one amplifier coupled to each memory cell array, the amplifier for amplifying a signal emitted from each memory cell in a word line indicative of data stored in the cell, upon activation of the word line by the refresh decoder, the amplifier reading data stored in the word line, amplifying the data, and writing the amplified data into the word line for refreshing the data, the amplifier enabling data stored in the word line being refreshed to be read out of the device.

10. The device of claim 1 wherein the timer is programmable so that the write delay time period corresponds to the self refreshing time period.

11. A semiconductor memory device having internal self refreshing comprising:
 a plurality of memory cell arrays, each array comprising a matrix of rows and columns, a row of memory cells comprising a word line, each memory cell comprising a single transistor;
 a plurality of address terminals for receiving row address, column address, and memory array address signals, respectively;
 a plurality of row address decoders responsive to row address signals for generating a selected address indicative of a word line of a memory array where data is to be written into or read out of;
 a plurality of refresh decoders, one refresh decoder for each memory cell array;
 a plurality of sense amplifiers, one amplifier coupled to each memory cell array, the amplifier amplifying a signal emitted from each memory cell in a word line indicative of data stored in the cell, upon activation of the word line by the refresh decoder, the amplifier reading data stored in the word line, amplifying the data, and writing the amplified data into the word line for refreshing the data, the amplifier enabling data stored in the word line being refreshed to be read out of the device;
 an internal clock generator for generating and adjusting a self-refreshing time period, the clock generator provided with programmable elements comprising fuse means, so that the fuse means may be opened for adjusting the self-refreshing time period;
 an address counter receiving output pulses from the clock generator for incrementing the counter, the counter generating an internal refreshing address and transmitting a refresh signal to a corresponding one of the refresh decoders for activating a memory word line corresponding to the refreshing address, the refresh decoders activating the word line so that the corresponding sense amplifier refreshes the data stored in the word line, the counter being incremented, such that once the data stored in a first word line of a first one of the memory cell arrays is refreshed, the internal refreshing address is incremented to a first word line of a second memory cell array, each word line being refreshed during one self-refreshing time period;
 a programmable timer for counting down a write delay time period;
 control logic coupled to the timer; and
 a comparator coupled to the address counter and to row address and memory address terminals, the comparator comparing an external address to be written, indicated by the row address signal, and the internal refreshing address generated by the counter,
 whereby if the comparator detects that the external address to be written matches the internal address being refreshed, the comparator transmits a signal to the control logic which signals the timer to begin counting down the write delay time period, the control logic enables the data to be written to the refreshed address upon the termination of the write delay time period, such that a maximum write delay time period is equal to one self-refreshing time period.

12. The device of claim 11 wherein the internal clock generator comprises a programmable CMOS ring oscillator, the oscillator provided with programmable elements comprising fuse means, so that the fuse means may be opened for increasing the self-refreshing time period, the self-refreshing time period being adjustable to different time periods depending upon the intended use of the device for minimizing power consumed by the device.

13. The device of claim 11 wherein each of the memory cells comprises a single transistor for providing a relatively low cost of manufacture of the device and for providing a device that has substantially high data storage capacity ranging up to approximately four to six times greater than the data storage capacity of a like dimensioned static random access memory semiconductor device.

14. The device of claim 11 wherein the device has a pin-out configuration analogous to a pin-out configuration of a static random access memory device.

15. The device of claim 11 wherein the address counter further increments the internal refreshing address, such that data stored in a first word line in a first memory cell array corresponding to the internal refreshing address is refreshed, the counter then increments the refreshing address to a first word line in a second memory cell array for refreshing data stored in the word line, the counter continuously incrementing the internal refreshing address until data stored in the first word line in each of the memory cell arrays, of the plurality of memory cell arrays, is refreshed, the counter then incrementing the refreshing address to a second word line in the first memory cell array for refreshing data stored in the word line, the counter then incrementing the refreshing address to a second word line in the second memory cell array for refreshing data stored in the word line, the counter continuously incrementing the internal refreshing address until a last word line in a last one of the memory cell arrays is refreshed, the counter then incrementing the refreshing address to the first word line in the first memory cell array for refreshing data stored in the word line, such that the counter continuously increments the refreshing address for continuously refreshing data stored in each word line of each memory cell array during one self-refreshing time period, for preventing a substantially long write delay time period and to reduce noise generated by the device when data is refreshed.

16. The device of claim 11 wherein the timer is programmable so that the write delay time period corresponds to the self-refreshing time period.

17. A semiconductor memory device having internal self-refreshing comprising:

a plurality of memory means, each of the memory means comprising a plurality of dynamic memory cells arrayed in a matrix of rows and columns, a row of memory cells comprising a word line;

address means for receiving row address, column address, and memory cell array address signals;

row address decoder means responsive to row address signals for generating a selected address indicative of a word line of a memory array where data is to be written into or read out of;

a plurality of refresh decoder means for activating word lines to be refreshed;

sense amplifier means, the amplifier means amplifying signals emitted from a word line indicative of data stored in the word line, upon activation of a word line by the refresh decoder means, the amplifier means reading data stored in the word line, amplifying the data, and writing the amplified data into the word line for refreshing the data, the amplifier means enabling data stored in the word line being refreshed to be read out of the device;

programmable internal oscillation means for generating and adjusting a self-refreshing time period;

address counting means coupled to the oscillation means for receiving output pulses therefrom to increment the counting means, the counting means generating an internal refreshing address and transmitting a refresh signal to a corresponding one of the refresh decoder means for activating a memory word line corresponding to the refreshing address, the refresh decoder means activating the word line so that the corresponding sense amplifier means refreshes the data stored in the word line, the counting means being continuously incremented, such that once the data stored in a first word line of a first one of the memory cell arrays is refreshed, the internal refreshing address is incremented to a first word line of a second memory cell array, each word line being refreshed during one self-refreshing time period;

programmable timer means for counting down a write delay time period;

logic means coupled to the timer means; and internal comparator means coupled to the address counting means and to the row address decoder means, the comparator comparing an external address to be written, indicated by the row address signal, and the internal refreshing address generated by the counting means, whereby if the comparator means detects that the external address to be written matches the internal address being refreshed, the comparator means transmits a match signal to the logic means to prevent the data from being written, the logic means signaling the timer to begin counting down the write delay time period, the logic means enabling the data to be written to the refreshed address once the write delay has expired, such that a maximum write delay time period is equal to one self-refreshing time period for preventing a substantially long write delay time period and to reduce noise generated by the device when data is refreshed.

18. The device of claim 17 wherein the oscillation means comprises a programmable CMOS ring oscillator, the oscillator provided with programmable elements comprising fuse means, so that the fuse means may be opened for increasing the self-refreshing time period, the self-refreshing time period being adjustable to different time periods depending upon the intended use of the device for minimizing power consumed by the device.

19. The device of claim 17 wherein each of the memory cells comprises a single transistor for providing a relatively low cost of manufacture of the device and for providing a device that has substantially high data storage capacity ranging up to approximately four to six times greater than the data storage capacity of a like dimensioned static random access memory semiconductor device.

20. The device of claim 17 wherein only a predetermined word line containing data to be read is activated during a read cycle for reducing the read cycle of the device, and wherein the device has read and write timing cycles analogous to read and write timing cycles of a static random access memory device.

21. A method of internal self-refreshing in a semiconductor memory device, the method comprising the steps of:

providing a plurality of memory cell arrays, each array comprising a matrix of rows and columns, a row of memory cells comprising a word line, each memory cell comprising a single transistor;

providing a plurality of address terminals for receiving row address, column address, and memory array address signals, respectively;

providing a plurality of row address decoders responsive to row address signals for generating a selected address indicative of a word line of a memory array where data is to be written into or read out of;

providing a plurality of refresh decoders for activating a word line to be refreshed, one refresh decoder for each memory cell array;

providing a plurality of sense amplifiers, one amplifier coupled to each memory cell array, the amplifier amplifying a signal emitted from each memory cell in a word line indicative is of data stored in the cell, upon activation of the word line by the refresh decoder, the amplifier reading data stored in the word line, amplifying the data, and writing the amplified data into the word line for refreshing the data, the amplifier enabling data stored in the word line being refreshed to be read out of the device;

providing an internal clock generator for generating and adjusting a self-refreshing time period;

providing an address counter for receiving output pulses from the clock generator for incrementing the counter, the counter generating an internal refreshing address and transmitting a refresh signal to a corresponding one of the refresh decoders for activating a memory word line corresponding to the refreshing address, the refresh decoders activating the word line so that the corresponding sense amplifier refreshes the data stored in the word line, the counter refreshing the memory cell arrays using a refresh process comprising the steps of;

(a) incrementing the internal refreshing address to a first word line in a first memory cell array corresponding to the internal refreshing address, (b) signaling a corresponding refresh decoder for activating the word line, (c) upon activation of the word line by the refresh decoder, the amplifier reading data stored in the word line, amplifying the data, and writing the amplified data into the word line for refreshing the data stored in the word line, (d) incrementing the refreshing address to a first word line in a second memory cell array, (e) repeating steps (b) and (c), (f) continuously incrementing the internal refreshing address until data stored in the first word line in each of the memory cell arrays, of the plurality of memory cell arrays, is refreshed, (g) incrementing the refreshing address to a second word line in the first memory cell array, (h) repeating steps (b) and (c), (i) incrementing the refreshing address to a second word line in the second memory cell array, (j) continuously incrementing the internal refreshing address until a last word line in a last one of the memory cell arrays is refreshed, (k) incrementing the refreshing address to the first word line in the first memory cell array, (l) repeating steps (b) and (c), such that the counter continuously increments the refreshing address for continuously refreshing data stored in each word line of each memory cell array, each word line being refreshed during one self-refreshing time period;

providing a programmable timer for counting down a write delay time period; providing control logic coupled to the timer; and providing a comparator coupled to the address counter and to row address and memory address terminals, the comparator comparing an external address to be written, indicated by the row address signal, and the internal refreshing address generated by the counter, whereby if the comparator detects that the external address to be written matches the internal address being refreshed, the comparator transmits a match signal to the control logic to prevent the data from being written, the control logic signaling the timer to begin counting down the write delay time period, the control logic enables the data to be written to the refreshed address once the write delay has expired, such that a maximum write delay time period is equal to one self-refreshing time period for preventing a substantially long write delay time period and to reduce noise generated by the device when data is refreshed.

22. The method of claim 21 wherein only a predetermined word line containing data to be read is activated during a read cycle for reducing the read cycle time period of the device, and wherein the device has read and write timing cycles analogous to read and write timing cycles of a static random access memory device.

23. The method of claim 21 wherein each of the memory cells comprises a single transistor for providing a relatively low cost of manufacture of the device and for providing a device that has substantially high data storage capacity ranging up to approximately four to six times greater than the data storage capacity of a like dimensioned static random access memory semiconductor device.

24. The method of claim 21 wherein the device has a pin-out configuration analogous to a pin-out configuration of a static random access memory device.

\* \* \* \* \*